(12) United States Patent
Duffy et al.

(10) Patent No.: US 9,548,224 B2
(45) Date of Patent: Jan. 17, 2017

(54) METHOD AND APPARATUS TO CONTROL SURFACE TEXTURE MODIFICATION OF SILICON WAFERS FOR PHOTOVOLTAIC CELL DEVICES

(75) Inventors: Edward Duffy, Dublin (IE); Laurent Clochard, Dublin (IE)

(73) Assignee: ULTRA HIGH VACUUM SOLUTIONS LTD., Dublin (IE)

( * ) Notice: Subject to any disclaimer, the term of this patent is extended or adjusted under 35 U.S.C. 154(b) by 56 days.

(21) Appl. No.: 13/696,730

(22) PCT Filed: May 11, 2011

(86) PCT No.: PCT/EP2011/057633
§ 371 (c)(1),
(2), (4) Date: Nov. 30, 2012

(87) PCT Pub. No.: WO2011/141516
PCT Pub. Date: Nov. 17, 2011

(65) Prior Publication Data
US 2013/0069204 A1    Mar. 21, 2013

(30) Foreign Application Priority Data

May 11, 2010 (IE) .................................. S2010/0287
Dec. 22, 2010 (GB) .................................. 1021693.5

(51) Int. Cl.
*H01L 31/0236* (2006.01)
*H01L 21/67* (2006.01)
(Continued)

(52) U.S. Cl.
CPC ..... *H01L 21/67069* (2013.01); *H01L 31/0236* (2013.01); *H01L 31/1804* (2013.01); *Y02E 10/547* (2013.01); *Y02P 70/521* (2015.11)

(58) Field of Classification Search
CPC ................... H01L 21/02019; H01L 21/30604; H01L 21/31116; H01L 21/31138; H01L 33/22; H01L 21/322; H01L 21/3223; H01L 21/32132; H01L 21/3213
(Continued)

(56) References Cited

U.S. PATENT DOCUMENTS 4,803,947 A    2/1989 Ueki et al.
4,834,020 A *  5/1989 Bartholomew et al. ...... 118/719
(Continued)

FOREIGN PATENT DOCUMENTS

EP    0690479    1/1996
JP    2003142298    5/2003
(Continued)

OTHER PUBLICATIONS

Saito et al., Honeycomb-textured structures on crystalline silicon surfaces for solar cells by spontaneous dry etching with chlorine trifluoride gas, 2007, Elsevier, Solar Energy Materials & Solar Cells, 91, pp. 1800-1804.*

(Continued)

*Primary Examiner* — Julia Slutsker
*Assistant Examiner* — Natalia Gondarenko
(74) *Attorney, Agent, or Firm* — K&L Gates LLP

(57) ABSTRACT

A method and apparatus to modify the surface structure of a silicon substrate or deposited silicon layer in a controllable manner using gas only in an atmospheric environment, suitable for making photovoltaic (PV) wafer based devices. The method and apparatus comprising the steps of disposing the substrate or deposited layer on a moveable carrier; pre-heating the substrate or deposited layer; and moving the substrate or deposited layer for etching through an atmospheric reactor; under an etchant delivering module inside the reactor and applying at least one etchant in gas form at (Continued)

a controlled flow rate and angle to the substrate or deposited layer in the reactor, wherein the at least one etchant gas is selected from the group comprising fluoride-containing gases and chlorine-based compounds. The technical problem that has been solved is the provision of a high throughput dry etching method at atmospheric pressure. This apparatus does not require plasma to aid the etching process using fluoride-containing gases and chlorine-based compounds and is performed at open atmospheric pressure. The use of elemental fluorine, which has a significantly lower bonding energy than any of the other etchants used to date, allows for the use of much lower power energy source to crack the elemental fluorine in to its etching radicals. The apparatus enables the delivery of a predetermined texture finish by controlling the flow rate of the gasses which are bombarded on the surface of the substrate.

14 Claims, 5 Drawing Sheets

(51) Int. Cl.
*H01L 31/18* (2006.01)
*H01L 21/30* (2006.01)

(58) Field of Classification Search
USPC .............. 438/706, 715, 719, 735, 737, 738, 743,438/744; 257/618, E29.005, E21.219; 156/345.51, 345.24; 118/719, 715, 725, 118/729
See application file for complete search history.

(56) References Cited

U.S. PATENT DOCUMENTS

| | | | |
|---|---|---|---|
| 5,122,391 A * | 6/1992 | Mayer | 427/126.3 |
| 5,423,944 A | 6/1995 | Wong | |
| 6,024,888 A * | 2/2000 | Watanabe et al. | 216/73 |
| 6,500,356 B2 | 12/2002 | Goto et al. | |
| 6,730,600 B2 | 5/2004 | Layadi et al. | |
| 6,737,812 B2 | 5/2004 | Yuasa et al. | |
| 2004/0231695 A1* | 11/2004 | Ohno et al. | 134/1 |
| 2005/0085089 A1 | 4/2005 | Kang | |
| 2006/0138539 A1* | 6/2006 | Stadler et al. | 257/347 |
| 2007/0224830 A1* | 9/2007 | Samoilov | 438/714 |
| 2008/0000497 A1 | 1/2008 | Verhaverbeke | |
| 2008/0142046 A1 | 6/2008 | Johnson et al. | |
| 2008/0305643 A1 | 12/2008 | Heintze et al. | |
| 2010/0025717 A1* | 2/2010 | Fujii et al. | 257/98 |
| 2010/0062608 A1 | 3/2010 | Hopfe et al. | |
| 2011/0045627 A1* | 2/2011 | Sachs et al. | 438/71 |

FOREIGN PATENT DOCUMENTS

WO 2008102807 8/2008
WO WO 2008100603 A1 * 8/2008

OTHER PUBLICATIONS

PCT International Search Report and Written Opinion of the International Searching Authority for International Application No. PCT/EP2011/057633, mailed Nov. 16, 2011, 12 pgs.

* cited by examiner

METHOD AND APPARATUS TO CONTROL SURFACE TEXTURE MODIFICATION OF SILICON WAFERS FOR PHOTOVOLTAIC CELL DEVICES

CROSS REFERENCE TO RELATED APPLICATIONS

This is the national phase under 35 U.S.C. §371 of International Application No. PCT/EP2011/057633, filed on May 11, 2011, which claims priority to and the benefit of Irish Patent Application No. S2010/0287, filed on May 11, 2010 and British Patent Application No. 1021693.5, filed on Dec. 22, 2010, the entire disclosures of each of which are incorporated by reference herein.

FIELD OF THE INVENTION

The invention relates to a method and apparatus for dry chemical texturing of silicon based photovoltaic (PV) devices. More particularly, the invention relates to a method and apparatus for inline, continuous pass-through dry chemical etching at atmospheric pressure without the use of a plasma discharge to create the active etchant species.

BACKGROUND TO THE INVENTION

Solar cells are photovoltaic (PV) semiconductor devices that convert sunlight into electricity. Photons from the sunlight knock electrons loose from their atoms, generating a current through the material. These photovoltaic semiconductors may be made from single crystal silicon (mono-crystalline), polycrystalline (multi-crystalline) silicon, amorphous silicon or other compound semiconductor materials. In simple terms an electrical P-N junction is created in PV material or substrate i.e. silicon wafer. This material is then connected to an electrical circuit by means of the positive and negative electrode. When exposed to sunlight a current is generated in the PV material due to a photoelectric effect.

There are various processing methods used to manufacture a PV solar cell, and several manufacturing process steps are required. Of particular interest for this invention are the etching steps, where a controlled amount of material has to be removed from the substrate and deposited layers; including wafer damage removal, cleaning, texturing, polishing, and by-product (PSG) removal.

Texturing of the substrate material; more particularly the control of this texturing is difficult to achieve. Different textures have been shown to have different enhancing properties for different solar cell substrates and designs. In most solar cell designs, when a light trapping pattern is textured onto the starting substrate on the sunny side of the wafer, an increase in cell efficiency is observed. Texturing the surface of the substrate will enlarge the surface area and lower the reflectivity of the base material therefore capturing more of the light that falls on the surface. However the texture needs to be carefully controlled and optimised so as integrate well with subsequent steps in the solar cell manufacturing process. The textures that are formed need to be easily doped and passivated and must not damage the carrier lifetimes of the base silicon substrate. These demands on the texture for PV solar cell manufacturing require a much higher level of control over the process than has been previously available. In the prior art, for example, the use of wet chemicals etching cannot deliver optimised textures for different cell designs as the etching mechanism is defined by the crystallographic structure of the substrate to be etched. Also, true single-sided etching of a substrate is not offered. As an alternative to wet chemical etching some methods have been proposed, including reactive ion etching and other plasma based silicon etching techniques well known to semiconductor device manufacturing. These plasma based techniques can have a detrimental effect on the carrier lifetimes of the base silicon and in some cases do not lead to a texture that can be easily passivated.

Wet Chemical Etching is the current state of the art for PV solar cell manufacturing. Currently these steps are carried out via a wet chemical process where the silicon substrates are dipped in a heated Acidic or Alkaline solution for a period of time to form uneven patterns on the surface of the substrate.

The problems associated with wet chemical etching for crystalline solar cells production are:

1. Very large amounts of water and other chemicals are consumed during these wet chemical etch steps.
2. Wet etch process is not adequate for thinner wafers (<160 μm).
3. Texturing by the traditional alkaline wet chemical etching of the cheaper multi-crystalline silicon solar cell does not give satisfactory antireflective properties. This is due to anisotropic nature of the multi-crystalline silicon substrate.
4. The process of record for multi-crystalline silicon solar cell manufacturing is to use an additional wet etch step using an acidic solution e.g. a mix of HF and HNO3. This "Isotexturing" results in lower reflection than the traditional anisotropic etching on multi-crystalline substrates. However, as outlined in point 1, it does not give the same results as traditional alkaline etching on mono-crystalline substrates. This leaves the overall cell conversion efficiencies of multi-crystalline silicon solar cells to lag behind the conversion efficiencies of the more expensive mono-crystalline silicon solar cells.
5. The wet etch equipment can be very large (in same case up to 17 m long) and has limited process throughput capability.
6. Wet etch efficiency is highly dependent the crystallographic structure of the wafer and requires different chemicals recipes for mono or multi-Si wafer.
7. Limited single sides of the wet process that does not provide for decoupled surface treatment.
8. Wet etch needs some defects in the wafer to work. It does not work from a smooth surface.

Dry etching plasma-less processes have been recently used for vacuum chamber cleaning application. For example, as described in US2008142046, molecular Fluorine (F2) was used for the cleaning of Silicon Nitride (SiNx) in a chemical vacuum deposition (CVD) chamber. Pre-diluted fluorine in an inert gas is delivered into the vacuum chamber and the fluorine is thermally dissociated by heating the chamber to a temperature between 230 to 565 deg C. The undesired silicon nitride is removed from the inner chamber's surfaces by chemical reaction. This vacuum chamber cleaning process is required in order to prevent cross-process contamination.

U.S. Pat. No. 6,500,356 (B2) describes a dry etching process that selectively etch Silicon on electronic devices, without etching Silicon oxide or silicon nitride. The specification is very much restricted to holding the substrate in the interior of a vacuum chamber and supplying the etch gas to the same chamber, at less than atmospheric pressure (260 millitorr (mT)).

Dry etching of PV solar cells has been under development for some time. There have been numerous publications using traditional vacuum based plasma etching techniques. The main problem with these methods is the PV material is damaged caused by the ions from the plasma during the etching process. Although some progress has been made in regard to this plasma damage issue, the commercialisation of such solutions is unlikely as the cost of the vacuum-based systems is prohibitive and the low throughput is not suitable for large-scale solar PV cell manufacturing.

There has also been work done regarding atmospheric plasma used to treat, clean and, in some cases, modify the surface of various substrates. In EP0690479 a method utilising an atmospheric plasma discharge to treat substrates at atmospheric pressure is described. Similarly, US2008/0000497 A1 describes a method of removing organic-containing layers using a plasma discharge.

In US 2008/0305643 an atmospheric plasma etching apparatus to remove the doped surface layers on the back faces of a crystalline solar wafer is described. Similarly, US 2010/0062608 describes an apparatus to selectively etch the phosphorus silicate glass (PSG) formed during the diffusion process using a plasma-based process. All of this state of the art is based on work utilising plasma discharge technology and using the plasma to generate the active species required to do the work on the substrates.

U.S. Pat. No. 4,803,947 discloses an apparatus for deposition of thin film amorphous Si PV films and surface treatment of PV substrates utilising a non-plasma technique. U.S. Pat. No. 4,803,947 makes reference to the use of $F_2$ to affect a texture or "coarsening" on the surface to aid light absorption. It also describes an array of chambers that are connected but the process regions are separated by purge gas curtains. This apparatus utilises a Roll-to-Roll method that is limited for use with flexible substrates that can be conveyed and collected on rollers. The use of the purge curtains is limited to separating process reaction spaces within a larger enclosed system that house all process chambers along with the delivery and collection roller chambers. Even with the capability of moving the substrates freely between process chambers, there is no continuous production. When the process is complete both the deployment and collection rolls would need to be changed and the system opened in some way that is not described. The coarsening effected by the use of $F_2$ is not claimed to be controlled or optimised in any way. The flow levels and pressure described indicate that this process takes place in a vacuum i.e. 30 SCCM at 1.5 torr. However, this method is not suitable for processing wafers.

There is therefore a need to provide a process and apparatus for dry etching/texturing of crystalline silicon photovoltaic solar cell wafers and control, which overcomes the above-mentioned problems.

SUMMARY OF THE INVENTION

According to the present invention there is provided, as set out in the appended claims, a method to modify the surface structure of a silicon substrate or deposited silicon layer to a desired texture, suitable for making photovoltaic (PV) devices, the method comprising the steps of:
  disposing the substrate or deposited layer on a moveable carrier;
  pre-heating the substrate or deposited layer;
  continuously moving the substrate or deposited layer for etching from an external ambient environment through a purge gas containment curtain, and into an open atmospheric reactor;
  continuously moving the substrate into or through an etchant delivering feature inside the reactor;
  applying at least one etchant in gas form to the substrate or deposited layer in the reactor so as to create the desired texture on the substrate by controlling the flow rate and angle of the applied etchant gas; and
  continuously moving the substrate or deposited layer for etching out from the open atmospheric reactor and through a further or same set of purge gas containment curtains to the external ambient environment,
wherein the at least one etchant gas is selected from the group comprising fluoride-containing gases and chlorine-based compounds.

The technical problem that has been solved is the provision of a high throughput dry etching method which does not require plasma or a vacuum to aid the etching process using fluoride-containing gases and chlorine-based compounds and which is performed at atmospheric pressure. The use of elemental fluorine, which has a significantly lower bonding energy than any of the other etchants used to date, allows for the use of a much lower power energy source to crack the elemental fluorine into its active radicals. As the method can be run at atmospheric pressure, and can utilise a set of purge gas containment curtains, this allows the continuous movement of the work pieces into and through the etching zone and enables much higher throughput required by the PV industry. The use of elemental or molecular fluorine without the aid of plasma at atmospheric pressure for dry etching of substrates provides a simple effective process for controlled etching of a substrate or deposited layer, leading to the creation of predefined textures and structures on the substrate material. The simplicity and the high level of control over the types of textures that can be achieved allows for optimisation of the overall cell manufacturing process and enables a particular texture to be selected to match the cell design.

In one embodiment the etchant is activated thermally without the help of any plasma.

In one embodiment the etching may be controlled to give predefined texture on the substrate that can be easily integrated with the other process steps. i.e. can be easily passivated and can delivery enhancement in light trapping capabilities Here we have found that the etch rate can be controlled by changing the flow rate of the etchant as it interacts the substrate. By varying the gas flow rate and geometry of the etchant gas delivery module, velocities of between about 0.1 and 3 m/sec are achieved. The different geometry parameters include the gap between the substrate and the etchant delivery hardware ranging between about 2-40 mm. The angle of the etchant gas flow can be optimised with the direction and speed of the substrate as it passes through. The angle of the flow can be varied between about 0-180 Deg. relative to the substrate surface being etched. By carefully adjusting these parameters, different etch rates can be achieved resulting in different textures being created.

In one embodiment the feature size of the resulting texture can be controlled through varying the etch rate. The typical etch rate range achieved is between about 2-40 µm/min, and delivery textures with features having a size of between about 0.1 µm and 5 µm.

In one embodiment the gas delivery module comprises of a set of nozzles.

In one embodiment the gas delivery module comprises a flat plate with a plurality of apertures in a set pattern.

In one embodiment the gas delivery module comprises a set or row of apertures of different or the same lengths. In a preferred embodiment, the apertures comprise slits or gap openings.

In one embodiment the gas delivery module comprises a slit.

In one embodiment a single reactor may have one or more type of gas delivery systems to etch the substrates. The gas delivery systems can be arranged such that each delivers the same or a different texture on the substrates.

In one embodiment the different gas delivery modules could be arranged to carry out subsequent etch steps one after the other on the same substrate, thereby delivering a further texture on an already textured surface.

In one embodiment the process is carried out as a continuous pass through process.

In one embodiment the process is carried without the substrate stopping in the reactor zone.

In one embodiment the process is carried out where the substrate can stop once or multiple times in the reactor zone.

In one embodiment the substrate to be etched is delivered into the reactor zone and once the etching process is completed, the substrate is then moved out of the reactor in the direction from which it was delivered.

In one embodiment one side of a substrate may be etched without etching the opposite side.

In one embodiment the etchant is applied to the substrate or deposited layer under atmospheric pressure.

In one embodiment the reaction region of the reactor is sealed by purging gas curtains.

In one embodiment the pre-heating zone is located inside the purge gas curtains.

In one embodiment the resulting substrate's surface texture is rough to reduce its reflectivity and increase the light absorbed.

In one embodiment the resulting substrate's surface texture is smooth.

In one embodiment the etchant gas is molecular or atomic Fluorine, or any other silicon etching gas with an energy bond value that allows for thermal activation. The Fluorine concentration can be any concentration in a range of between about 5 to 100%.

In one embodiment the fluoride-containing gases may be selected from the group comprising tetrafluoromethane, trifluoromethane, carbonyl fluoride, sulphur hexafluoride, nitrogen trifluoride, xenon difluoride, and elemental fluorine.

In one embodiment, the chlorine-based compounds may be selected from the group comprising tetrachloromethane, a mixture of trichlorosilane and hydrogen, and hydrogen chloride.

Each etch gas may have its own method of etching radical formation.

In one embodiment the substrate for etching may be selected from the group comprising a photovoltaic solar cell, a silicon wafer, or a layer deposited on substrates such as, for example, glass, AlTiC (Aluminum Titanium Carbon), ITO (Indium tin oxide) and FR4 laminates (woven fibreglass cloth with an epoxy resin binder that is flame resistant).

In another embodiment this atmospheric dry etching technology may be used in conjunction with laser micromachining process. The laser machining/drilling damages a region of the material being cut and a dry etch may be performed after or during the machining/drill process to remove/repair the damaged regions.

In another embodiment, this method may be used in the manufacture of capacitive sensing touch screens, where a matrix of micro holes are etched into the ITO and FR4 fibreglass reinforced epoxy laminates and PCBs (printed circuit boards).

According to a further embodiment of the invention there is provided an apparatus to modify the surface structure of a silicon substrate or deposited silicon layer in a controllable manner using gas only, suitable for making photovoltaic (PV) devices, the apparatus comprising:
 (i) a housing;
 (ii) an atmospheric reactor;
 (iii) at least one etchant gas exhaust plenum;
 (iv) means for disposing the substrate or deposited layer on a moveable carrier;
 (v) means for pre-heating the substrate or deposited layer;
 (vi) means for continuously moving the substrate or deposited layer for etching through the atmospheric reactor;
 (vii) means for continuously moving the substrate under an etchant delivering module inside the reactor by applying at least one etchant in gas form under pressure to the substrate or deposited layer in the reactor; and
 (viii) means of controlling the etch rate of the process, wherein the at least one etchant gas is selected from the group comprising fluoride-containing gases and chlorine-based compounds.

According to another aspect of the present invention there is provided an apparatus for dry etching a substrate comprising:
 (i) a housing;
 (ii) an etchant gas delivery reactor;
 (iii) at least one etchant gas exhaust plenum; and
 (iv) a means for delivering etchant gas to the housing at atmospheric pressure.

In one embodiment the etchant gas in the atmospheric reactor may be heated to produce base radicals to perform the dry etching.

In one embodiment the atmospheric reactor may be heated to a temperature of between about room temperature and 450 deg C. In the present specification, the term "room temperature", abbreviated to RT, should be understood to mean a temperature of between about 20 deg. C. and about 25 deg. C. (about 68 deg. F. to about 77 deg. F.).

In a further aspect of the present invention, there is provided a device comprising a substrate etched by the method described above.

In one embodiment the device may be selected from the group comprising a photovoltaic solar cell, a silicon wafer, a glass substrate, a layer deposited on a wafer substrate (amorphous silicon, SiNx, SiOx).

In another embodiment there is provided a method for dry etching a substrate or deposited layer in order to modify its surface structure or remove a controlled thickness, comprising the steps of:
 (i) disposing the substrate for etching on a support substrate;
 (ii) pre-heating the substrate;
 (iii) delivering the substrate for etching to an etching chamber; and
 (iv) applying at least one etchant in gas form under pressure to the substrate in the chamber,
wherein the at least one etchant gas is selected from the group comprising fluoride-containing gases and chlorine-based compounds. Preferably the pressure may be atmospheric pressure.

BRIEF DESCRIPTION OF THE DRAWINGS

The invention will be more clearly understood from the following description of an embodiment thereof, given by way of example only, with reference to the accompanying drawings, in which:—

DETAILED DESCRIPTION OF THE DRAWINGS

The present invention uses a novel dry-etch chemistry where the etching is not limited by the crystalline structure of the surface to be etched. The etchants are controllably delivered in gaseous form and are applied to the surface to be etched at pressure. There is no requirement for the etching zone to be contained in a vacuum chamber.

Figure 1:
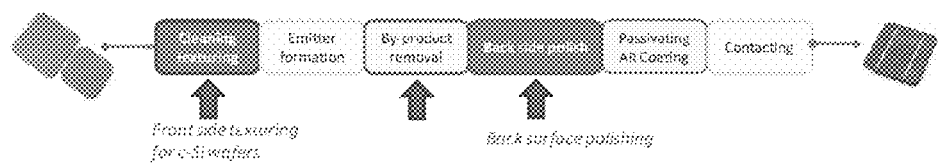
FIG. 1 is a flow diagram illustrating the dry etching process of the present invention.

FIG. 1 illustrates a general flow diagram of the method of the present invention to modify the surface structure of a silicon substrate or deposited silicon layer in a controllable manner using gas only, suitable for making photovoltaic (PV) devices, described in more detail with respect to FIGS. 2 to 6.

Figure 2:
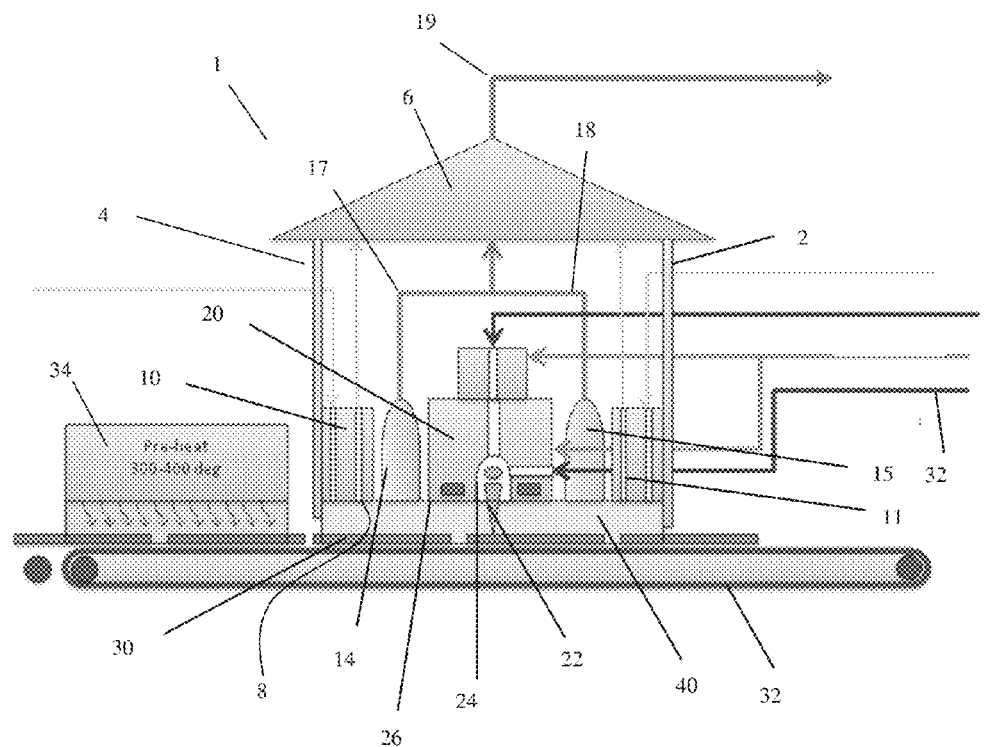
FIG. 2 illustrates a section view of a dry etching apparatus of the present invention.
Figure 3:
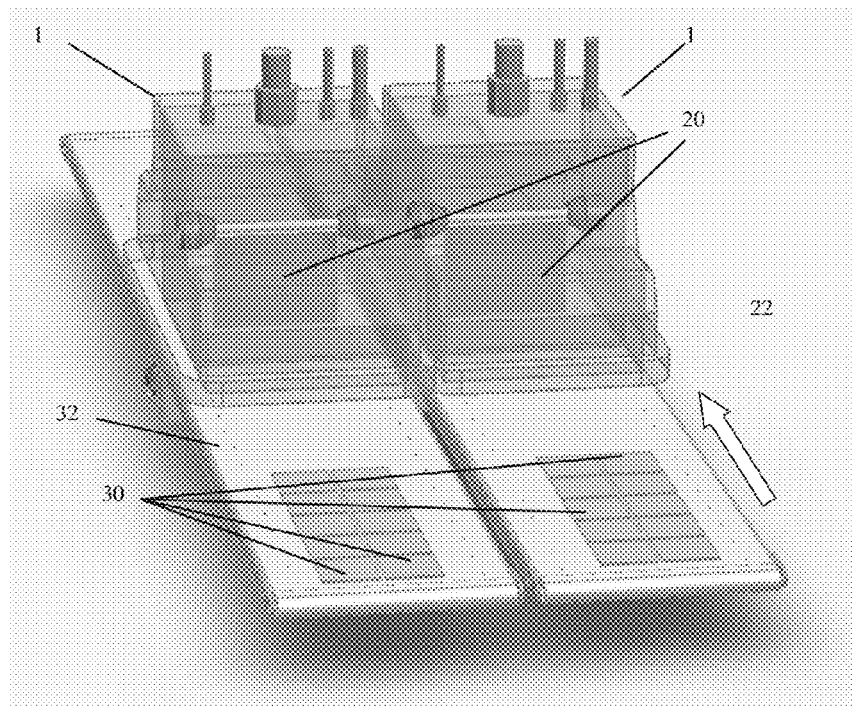
FIG. 3 illustrates a layout of the process of the present invention for continuous in-line processing of substrates at atmospheric pressure.

As illustrated in FIGS. 2 and 3, there is provided an apparatus to carry out the method of the invention. The apparatus is referred to generally with reference numeral 1 according to one embodiment of the invention. The apparatus comprises a housing 2 having walls 4, a cover 6, and a support 8 opposite and in a parallel plane to the cover 6. Within the housing 2 are located purge gas containment curtains 10, 11 nestled close to walls 4. The reactor zone is defined by the area within the curtains 10, 11. Inside this zone, and positioned towards the centre of the housing 2, are etchant gas exhaust plenums 14, 15, which are juxtaposed the curtains 10,11 respectively. The exhaust plenums 14, 15 are connected to each other via piping 17, 18 which funnels exhaust gases from inside the housing 2 to outside via a chute 19.

Figure 6:
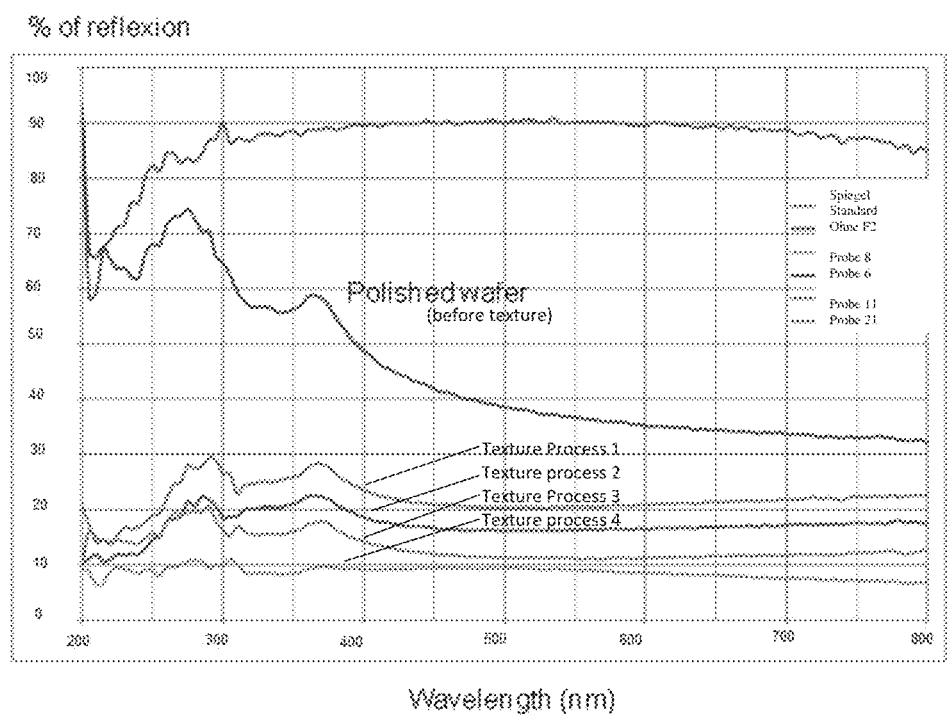
FIG. 6 illustrates reflection data for different textures created by different etching parameters on a single <100>-n-type polished Cz-silicon wafers.

Situated between plenums 14, 15 is an etchant gas delivery reactor 20. The delivery reactor 20 emits a curtain of gas 22 from an aperture 24 at a base 26 of the reactor 20. The etchant gas is then emitted from the aperture 24 onto a substrate 30. As outlined in the embodiments, there are a number of different settings and configurations that can be set for different etching parameters. FIG. 6 shows further details in this regard and is discussed in more detail below.

In use, as illustrated in FIG. 3, multiple lanes of the substrate 30 are placed on a conveyor belt 32 and delivered to a heating device 34. The substrate is pre-heated to a temperature of between about room temperature to about 450° C. prior to passing into the apparatus 1. The substrate 30 is exposed to heated etchant gas in a chamber 40 of the apparatus 1. Once the substrate 30 has been exposed to etchant gas for a predetermined period of time, the conveyor belt 32 moves the etched substrate 30 through the apparatus 1 and the next substrate to be etched is exposed to etchant gas.

It is the preferred embodiment of this invention to use elemental fluorine $F_2$ gas that is cracked or energized by simple heating in the delivery reactor 20 to produce fluorine base radicals to perform the etching on the surface of the substrates 30.

Figure 4:
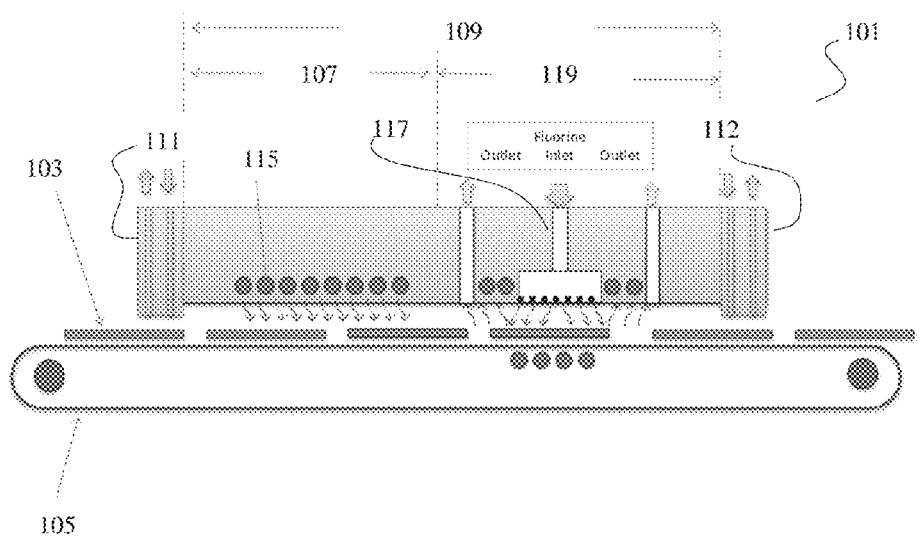
FIG. 4 illustrates another section view of a dry etching apparatus according to another embodiment of the invention.
Figure 5:
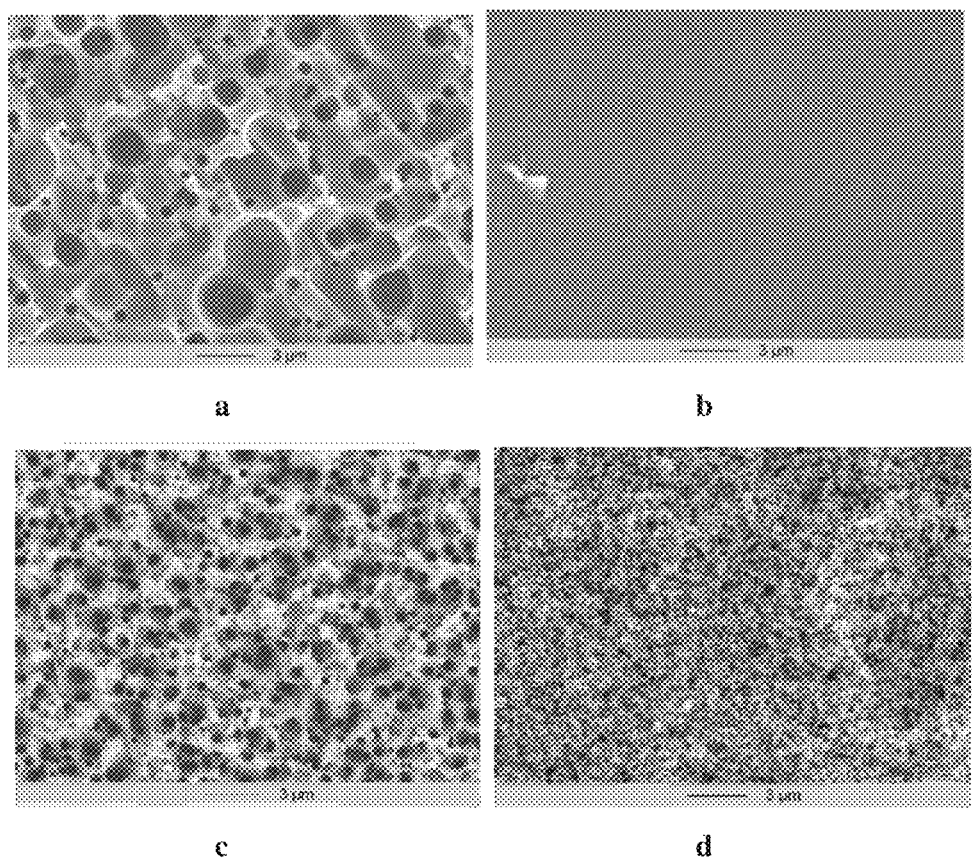
FIG. 5a-d illustrate SEM images of images of <100>-n-type polished Cz-silicon wafers demonstrating the various textures that can be achieved by varying the etching.

Referring to FIG. 4, there is illustrated an atmospheric reactor 101 adapted to perform the method of the invention. The substrate (or deposited layer) 103 is placed on a moveable carrier 105, for example a substrate conveyor, that is adapted to move continuously to deliver the substrate 103 to a heating zone 107, which is inside a reaction area 109. The heating zone can also be outside the reaction area. The reaction area 109 is sealed off by purge curtains 111,112 at the entrance and the exit. A preheating zone 107 is positioned inside the perimeter boundaries defined by the purge curtains. The preheating zone may also be positioned outside those defined perimeter boundaries. The substrate or deposited layer 103 is preheated by a heater 115; and is subsequently delivered to the chemical reactor zone 119 by the continuous conveyor 105. The conveyor moves the substrate through the reaction area 109 in a controlled manner such that under an etchant delivering feature 117 inside the reactor at least one etchant in gas form is applied under atmospheric pressure to the substrate or deposited layer in the reactor. The at least one etchant gas is selected from the group comprising fluoride-containing gases and chlorine-based compounds.

Referring now to FIGS. 5a-d; both 5a & 5b are illustrated SEM images of <100>-n-type polished Cz-silicon wafers taken from the same batch and etched with different parameters using the method of the present invention. The images clearly demonstrate that various textures can be achieved by varying the etching parameters of the present invention. A structure having a fine texture in the range of about 0.1-0.2 μm is shown in FIG. 5b and a rougher texture of pyramidal structures in the range of about 3-4 μm is shown in FIG. 5a. The parameters that have been varied in the case of those wafers illustrated in FIGS. 5a and 5b are gas flow rate and the angle at which the gas impinges the substrates. All other parameters remained constant i.e. atmospheric pressure, temperature (350 Deg C.), and a $F_2$ concentration of 15%. The SEM images illustrated in 5c & 5d are taken from two different <100>-n-type polished Cz-silicon wafers etched using different parameters. The parameters which were adjusted were gas flow rate and the angle at which the gas impinges the substrates. The resulting textures are finer, the resulting structure is quite "amorphous" and of the type that is generally difficult to passivate.

Figure 7:
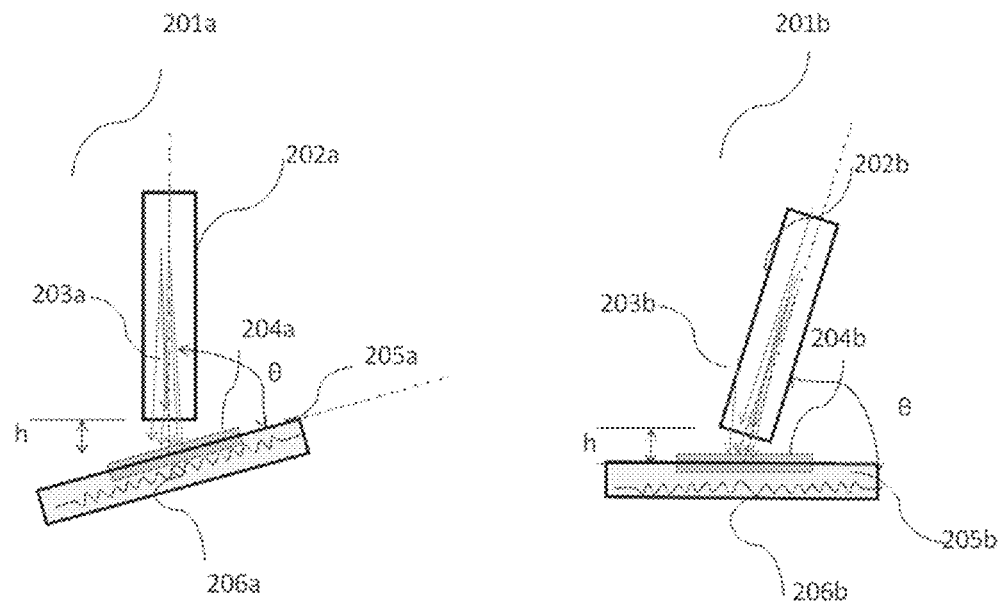
FIG. 7 illustrates the different mechanisms for achieving the angular setting required for the etching gas flow stream.

Different mechanisms for varying and controlling the gas delivery to the substrate to be etched in the reaction zone of the apparatus of the present invention can be used. There are two different mechanisms illustrated in FIG. 7, labelled as 201a and 201b. A substrate 204a and 204b, a conveyor 205a and 205b for carrying the substrate 204a and 205b, respectively, and the etch gas delivery module 202a and 202b are also illustrated for the mechanisms 201a and 201b, respectively. There is also shown a method of heating the substrate built into the conveyor 205a and 206b, and given the reference numeral 206a and 206b, respectively. FIG. 7 shows the different ways in which the etch gas 203a and 203b can be directed on to the substrate 204a and 204b, respectively, to be etched. In 201a the conveyor 205a and subsequently the substrate 204a can be arranged at different angles "θ" relative to the gas delivery module 202a. In 201b the gas flow reactor, and hence the gas delivery module 202b, can be arranged at various angles "θ" to achieve the different textures. In both cases for 201a and 201b, the gap between the substrate and the gas delivery module 202a and 202b, respectively, can be set at various heights "h".

Figure 8:
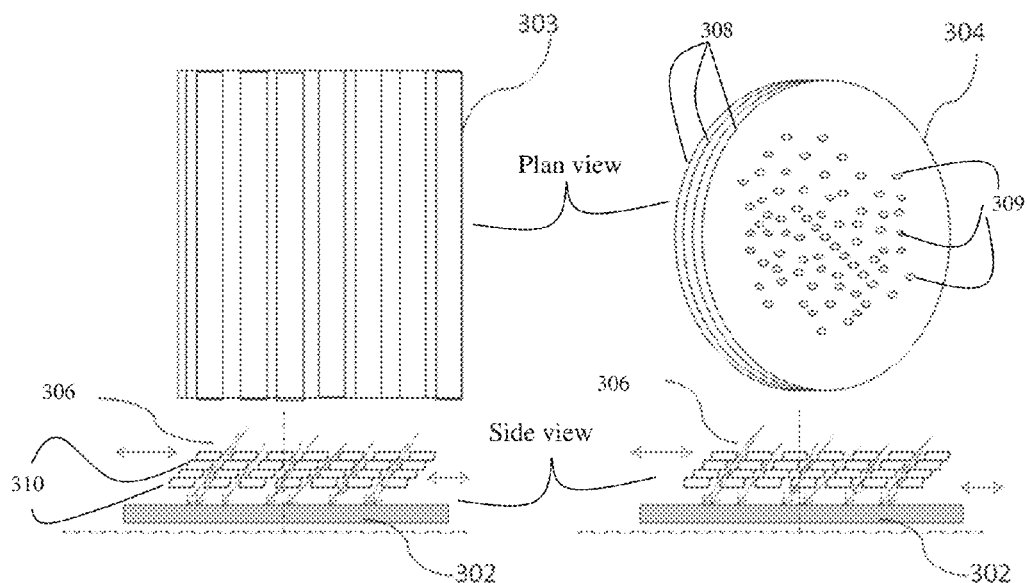
FIG. 8 illustrates alternative options for achieving the angular setting required for the etching gas flow stream.

FIG. 8 illustrates alternative options for setting the angle at which the etch gas is delivered. As shown in FIG. 8, a substrate 302 passes under gas delivery modules 303 and 304. Both gas delivery modules 303 and 304 are shown in plan view and side view, as indicated in FIG. 8. Gas delivery module 304 comprises a series of plates 308, each having a patterned plurality of apertures 309. The plates 308 can move relative to each other in a plane that is parallel to the wafer surface. In this way, the angle of the gas delivery channel that is created by the alignment of the apertures 309 can be modified and set as required. The angle at which the gas 306 hits the substrate 302 is illustrated. The same concept is demonstrated for gas delivery module 303 where the module 303 comprises an array of plates 310, each having apertures in the form of slits. The plates 310 are free to move relative to each other in a plane parallel to the wafer surface and so setting a desired gas delivery angle, as described above for gas delivery module 304.

In the specification the terms "comprise, comprises, comprised and comprising" or any variation thereof and the terms "include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A method of making a silicon substrate or a deposited silicon layer for photovoltaic (PV) devices, the method comprising:
    disposing the silicon substrate or deposited silicon layer on a moveable carrier;
    pre-heating the silicon substrate or deposited silicon layer in a pre-heating zone between 100 and 300 degrees Celsius;
    continuously moving the silicon substrate or deposited silicon layer for etching from an external ambient environment through a purge gas containment curtain, and into an open, heated etching chamber at atmospheric pressure and temperatures from 150 to 400 degrees Celsius;
    continuously moving the silicon substrate or deposited silicon layer through the etching chamber comprising an etchant delivering feature, while applying and controlling a flow rate of Fluorine ($F_2$) gas at atmospheric pressure and concentration between 5% and 100% to the silicon substrate or deposited silicon layer to lower surface reflectivity of silicon surface of the silicon substrate or deposited silicon layer and increase light absorption;
    controlling an angle between 0 and 45 degrees of the $F_2$ etchant gas being applied at atmospheric pressure; and
    continuously moving the silicon substrate or deposited silicon layer out from the open, heated etching chamber at atmospheric pressure and through a further or same set of purge gas containment curtains to the external ambient environment,
    wherein the $F_2$ etchant gas is activated thermally without need of any plasma, and wherein the $F_2$ etchant gas is applied to the silicon substrate or deposited silicon layer under atmospheric pressure to lower a surface reflectivity and increase light absorbed by the silicon substrate or deposited silicon layer.

2. The method according to claim 1 wherein the method is carried out as a continuous pass through process at constant velocity throughout.

3. The method according to claim 1 wherein the etchant delivering feature inside the chamber is sealed by purging gas curtains.

4. The method according to claim 1 wherein the etchant delivering feature inside the reactor is sealed by purging gas curtains and the pre-heating zone is located inside the purge gas curtains.

5. The method according to claim 1 comprising etching the silicon surface using the F2 etching gas in a controlled manner to create a surface texture that reduces reflectivity below 15% across wavelengths ranging from 200 to 800 nm, and increases light absorbed by the silicon substrate or deposited silicon layer.

6. The method according to claim 1 wherein oxygen or ozone is additionally provided to further decrease the surface reflectivity and increase the light absorbed by the silicon substrate or deposited silicon layer.

7. The method according to claim 1 wherein the substrate for etching is selected from the group consisting of a photovoltaic solar cell and a silicon wafer.

8. The method according to claim 1 performed in absence of plasma.

9. A device comprising a substrate etched by the method according to claim 1.

10. The device according to claim 9 selected from the group consisting of a photovoltaic solar cell, a silicon wafer, a glass substrate, and a layer deposited on a wafer substrate comprising amorphous silicon, $SiN_x$, or $SiO_x$.

11. The method according to claim 1 wherein the deposited silicon layer is deposited on a substrate selected from the group consisting of glass, AlTiC, ITO and FR4 laminates.

12. The method according to claim 1 wherein only one surface of the silicon wafer or layer is textured.

13. A device comprising a substrate etched by the method according to claim 1 leading to silicon surface reflectivity below 15% across wavelengths ranging from 200 to 800 nm.

14. A device comprising a substrate etched by the method according to claim 1 leading to silicon surface reflectivity below 5% across wavelengths ranging from 200 to 800 nm.

* * * * *